United States Patent
Stoica et al.

(10) Patent No.: US 12,087,379 B2
(45) Date of Patent: Sep. 10, 2024

(54) CALIBRATION OF THRESHOLD VOLTAGE SHIFT VALUES

(71) Applicant: INTERNATIONAL BUSINESS MACHINES CORPORATION, Armonk, NY (US)

(72) Inventors: Radu Ioan Stoica, Zurich (CH); Roman Alexander Pletka, Uster (CH); Nikolas Ioannou, Zurich (CH); Nikolaos Papandreou, Thalwil (CH); Charalampos Pozidis, Thalwil (CH); Timothy J. Fisher, Cypress, TX (US); Aaron Daniel Fry, Richmond, TX (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 17/821,608

(22) Filed: Aug. 23, 2022

(65) Prior Publication Data

US 2024/0071542 A1 Feb. 29, 2024

(51) Int. Cl.
*G11C 16/06* (2006.01)
*G06F 11/26* (2006.01)
(Continued)

(52) U.S. Cl.
CPC ............ *G11C 29/021* (2013.01); *G06F 11/26* (2013.01); *G06F 11/263* (2013.01); *G11C 16/3404* (2013.01); *G11C 29/52* (2013.01)

(58) Field of Classification Search
CPC ... G11C 29/021; G11C 16/3404; G11C 29/52; G06F 11/26; G06F 11/263
(Continued)

(56) References Cited

U.S. PATENT DOCUMENTS 8,547,740 B2 * 10/2013 Sommer ................ G11C 8/20
365/45
8,644,099 B2 * 2/2014 Cometti ................ G11C 16/10
365/201

(Continued)

FOREIGN PATENT DOCUMENTS

CN 112685213 A 4/2021

OTHER PUBLICATIONS

Pletka, et al., "Enabling 3D-TLC NAND Flash in Enterprise Storage Systems." Published Apr. 16, 2018 by Ercim News. 5 pages. https://ercim-news.ercim.eu/en113/r-i/enabling-3d-tlc-nand-flash-in-enterprise-storage-systems.

*Primary Examiner* — Viet Q Nguyen
(74) *Attorney, Agent, or Firm* — Matthew Zehrer

(57) ABSTRACT

Threshold voltage shift values, or TVS values, are calibrated for a non-volatile memory unit including strings of memory cells organized into memory pages, the memory pages being organized into blocks. The calibration involves a read operation to read a given page of the memory pages, based on given one or more TVS values for the given page. In response to a read failure of the read operation, the calibration determines one or more corrected TVS values based on one or more reference TVS values of one or more reference pages of the memory pages. The calibration subsequently performs a read operation to read the given page based on the one or more corrected TVS values. This calibration exploits TVS values of reference pages to determine corrected TVS values of the failing page, instead of finding appropriate TVS values by repeatedly re-reading the failing page.

20 Claims, 5 Drawing Sheets

(51) Int. Cl.
*G06F 11/263* (2006.01)
*G11C 16/34* (2006.01)
*G11C 29/02* (2006.01)
*G11C 29/52* (2006.01)

(58) Field of Classification Search
USPC .................................................. 365/185.09
See application file for complete search history.

(56) References Cited

U.S. PATENT DOCUMENTS

| | | | |
|---|---|---|---|
| 8,966,343 B2 * | 2/2015 | Syu .................... G06F 11/1072 365/185.11 |
| 9,251,909 B1 | 2/2016 | Camp | |
| 9,318,215 B2 * | 4/2016 | Desireddi ............. G11C 16/26 |
| 9,595,320 B2 * | 3/2017 | Wu .................... G11C 16/3454 |
| 10,222,997 B2 | 3/2019 | Camp | |
| 10,418,097 B2 * | 9/2019 | Avraham ............ G11C 29/028 |
| 10,453,537 B1 | 10/2019 | Reuter | |
| 10,529,433 B1 * | 1/2020 | Liikanen ................. G11C 7/18 |
| 10,559,366 B2 * | 2/2020 | Shen .................. G11C 16/0483 |
| 10,629,247 B2 * | 4/2020 | Kale ........................ G11C 7/14 |
| 10,642,747 B1 * | 5/2020 | Jagtap .................... G06F 12/10 |
| 10,658,054 B2 * | 5/2020 | Ioannou ............. G11C 16/3427 |
| 10,699,791 B2 * | 6/2020 | Pletka .................... G06F 3/0604 |
| 10,725,673 B2 * | 7/2020 | Zhou ...................... G06F 3/0619 |
| 10,734,087 B2 * | 8/2020 | Cohen ................. G11C 29/028 |
| 10,811,091 B2 * | 10/2020 | Bazarsky ............. G11C 29/028 |
| 10,824,352 B2 * | 11/2020 | Ioannou ................ G06F 11/073 |
| 10,957,407 B1 * | 3/2021 | Papandreou ........... G11C 16/08 |
| 11,024,396 B2 * | 6/2021 | Chen ...................... G11C 11/56 |
| 11,056,199 B2 | 7/2021 | Papandreou | |
| 11,120,882 B2 * | 9/2021 | Ioannou ................ G11C 29/52 |
| 11,158,376 B2 * | 10/2021 | Komatsu ............ G11C 16/349 |
| 11,334,492 B2 | 5/2022 | Papandreou | |
| 11,494,114 B1 * | 11/2022 | Eisenhuth ............. G06F 3/0619 |
| 11,631,467 B2 * | 4/2023 | Lee ...................... G11C 29/021 365/189.011 |
| 11,636,914 B2 * | 4/2023 | Takada ................... G11C 29/18 365/30 |
| 11,687,452 B2 * | 6/2023 | Besinga ............. G06F 12/0646 711/170 |
| 11,868,646 B2 * | 1/2024 | Eliash ................. G11C 11/5642 |
| 2017/0162268 A1 * | 6/2017 | Chen ...................... G11C 16/26 |
| 2019/0171381 A1 | 6/2019 | Ioannou | |
| 2020/0013471 A1 | 1/2020 | Cohen | |
| 2020/0066354 A1 | 2/2020 | Ioannou | |
| 2020/0066361 A1 | 2/2020 | Ioannou | |
| 2021/0124685 A1 | 4/2021 | Papandreou | |

* cited by examiner

| Word line | BL1 | | | | BL2 | | | | ... | BLM | | | |
|---|---|---|---|---|---|---|---|---|---|---|---|---|---|
| | LB1 | LB2 | LB3 | LB4 | LB1 | LB2 | LB3 | LB4 | ... | LB1 | LB2 | LB3 | LB4 |
| WL1 | - | - | - | - | - | - | - | - | ... | - | - | - | - |
| WL2 | - | - | - | p | - | - | - | p | ... | - | - | - | p |
| WL3 | - | p | p | p | - | p | p | p | ... | p | p | p | p |
| WL4 | p | p | p | p | p | p | p | p | ... | p | p | p | p |
| WL5 | p | p | p | p | p | p | p | p | ... | p | p | p | p |
| WL6 | p | p | p | p | p | p | p | p | ... | p | p | p | p |
| WL7 | p | p | p | p | p | p | p | p | ... | p | p | p | p |
| WL8 | p | p | p | p | p | p | p | p | ... | p | p | p | p |
| WL9 | p | p | p | p | p | p | p | p | ... | p | p | p | p |
| WL10 | p | p | p | p | p | p | p | p | ... | p | p | p | p |
| ... | ... | ... | ... | ... | ... | ... | ... | ... | ... | ... | ... | ... | ... |

FIG. 4

CALIBRATION OF THRESHOLD VOLTAGE SHIFT VALUES

BACKGROUND

The present disclosure relates to calibrating threshold voltage shift (TVS) values for non-volatile memory units. In particular, the present disclosure relates to exploiting TVS values of neighboring pages in a memory block to determine corrected TVS values for a failing memory page.

SUMMARY

In an embodiment of the present disclosure, a method of calibrating threshold voltage shift values for a non-volatile memory unit is presented. The non-volatile memory unit includes strings of memory cells organized into memory pages. The memory pages are each organized into blocks, The method includes performing a read operation to read a given page of the memory pages utilizing given one or more threshold voltage shift values for the given page. The method further includes, in response to a read failure of the read operation, determining one or more corrected threshold voltage shift values based on one or more reference threshold voltage shift values of one or more reference pages of the memory pages. The method further includes performing a read operation to read the given page utilizing the one or more corrected threshold voltage shift values.

In another embodiment of the present disclosure, a memory system is presented. The memory system includes a non-volatile memory unit and a controller. The non-volatile memory unit includes strings of memory cells organized into memory pages. The memory pages are each organized into blocks. The controller is connected to the memory cells and is configured for calibrating threshold voltage shift values for the non-volatile memory unit. The controller calibrates the threshold voltage shift values by performing a read operation to read a given page of the memory pages, based on given one or more threshold voltage shift values for the given page. The controller further calibrates the threshold voltage shift values by determining one or more corrected threshold voltage shift values based on one or more reference threshold voltage shift values of one or more reference pages of the memory pages, in response to a read failure of the read operation. The controller calibrates the threshold voltage shift values by performing a read operation to read the given page based on the one or more corrected threshold voltage shift values determined.

In another embodiment of the present disclosure, a computer program product for calibrating threshold voltage shift values for a non-volatile memory unit is presented. The non-volatile memory unit includes strings of memory cells organized into memory pages. The memory pages each organized into blocks. The computer program product includes a computer readable storage medium that includes program instructions embodied therewith. The program instructions are executable by a controller that is connected to the memory cells. The execution of the program instructions causes the controller to perform a read operation to read a given page of the memory pages, based on given one or more threshold voltage shift values for the given page. The execution of the program instructions further causes the controller to determine one or more corrected threshold voltage shift values based on one or more reference threshold voltage shift values of one or more reference pages of the memory pages, in response to a read failure of the read operation. The execution of the program instructions further causes the controller to perform a read operation to read the given page based on the one or more corrected threshold voltage shift values determined.

The above and other aspects, features, and advantages of various embodiments of the present disclosure will be more apparent from the following description taken in conjunction with the accompanying drawings.

BRIEF DESCRIPTION OF THE DRAWINGS

The above and other aspects, features, and advantages of various embodiments of the present disclosure will be more apparent from the following description taken in conjunction with the accompanying drawings.

FIG. 4 depicts interconnected memory pages of memory cells and depicts that one or more reference memory pages can be selected and utilized to infer corrected threshold voltage shift values for a failing memory page, in accordance with embodiments of the disclosure.

DETAILED DESCRIPTION

Figure 1:
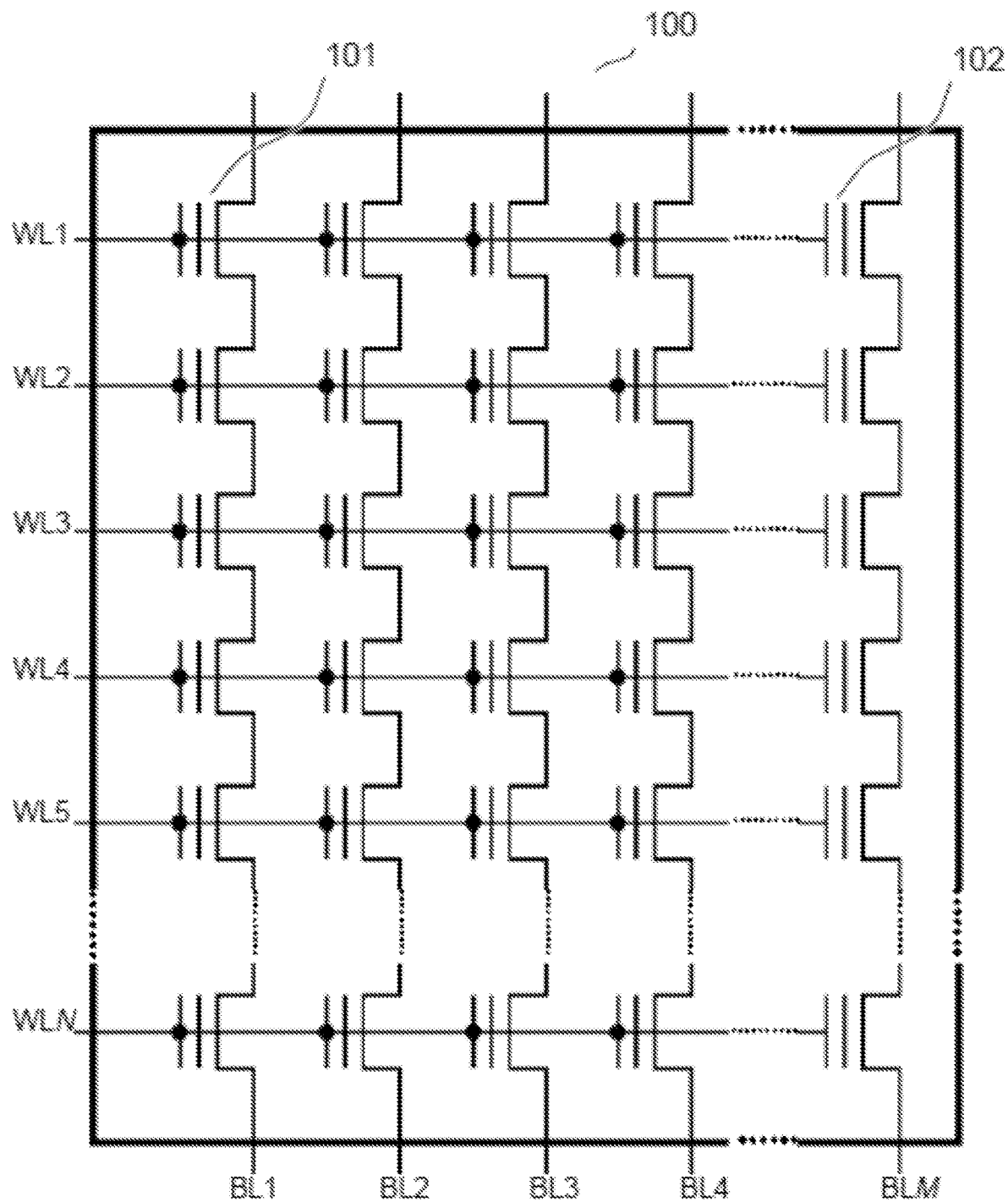
FIG. 1 depicts memory cells arranged in a block, in accordance with embodiments of the disclosure.

Threshold voltage (VTH) is the voltage above which a memory cell conducts current. The VTH depends on the amount of charge stored in the memory cell. Read threshold voltage shifting is used in block calibration to determine the optimal read threshold voltage shift values. Block calibration is an effective method to reduce the number of read errors and, thus, to prolong endurance and retention for non-volatile memory units, such as used in enterprise-level storage systems relying on, e.g., NAND flash memories. Typically, block calibration is periodically performed as part of an automated low-speed and low-priority background health check process, so as not to adversely impact user read or write operations. Endurance can be improved by setting optimal TVS values (which may also be referred to as read threshold voltage shift values in the literature) at the granularity of groups of pages per block that result in minimizing the maximum raw bit error rate of each block.

In NAND flash memories, NAND flash memory cells are typically organized by word lines and bit lines into blocks. A block may typically have about 10,000,000 to 100,000,000 memory cells. The hierarchical structure of NAND flash starts at the memory cell level. For example, NAND flash memory cells draw strings, then pages, blocks, planes, and ultimately a memory die. More precisely, a string is a series of connected NAND flash memory cells, in which the source of one NAND flash memory cell is connected to the drain of the next NAND flash memory cell. A string typically consists of 32 to 128 NAND flash memory cells, depending on the particular NAND technology used. Strings are organized into pages, which are themselves organized into blocks, in which each string is connected to a separate bit line (BL). The NAND flash memory cells that have the same position in the string are connected by a same word line (WL). A plane contains a number of blocks that are connected through the same BL. A NAND flash memory die consists of one or more of such planes, and the peripheral circuitry that performs read, write, and erase operations.

The NAND flash memory cells can be programmed as single-level cells (or SLCs, involving one bit per cell) or multi-level cells (or MLCs, involving at least two bits per cell). Using an SLC cell, for example, the VTH applied in combination with the charge stored by the NAND flash memory cell determines whether a NAND flash memory cell conducts current, which is interpreted as a logical 0 or a 1. If the VTH applied allows the NAND flash memory cell to conduct current, it is usually decided that a logical "1" has been stored in the NAND flash memory cell. Conversely, if the VTH applied is insufficient to allow the NAND flash memory cell to conduct current, it usually is decided that a logical "0" has been stored in the NAND flash memory cell. However, for MLCs, where multiple logical bits are stored in each cell, the number of possible threshold voltage levels in a NAND flash memory cell increases, and a more precise VTH determination is required for programming and readback of data stored in the NAND flash memory cells. This finer threshold voltage determination or setting makes MLCs prone to noise.

The raw bit error rate (RBER) of a NAND flash memory block typically increases over time after the NAND flash memory block was programmed, due to charge leakage and read disturb errors. Immediately after the NAND flash memory block is programmed, the starting RBER also increases with the program and erase (P/E) cycles that create defects in the NAND flash memory cells. Typically, a NAND flash memory block is retired when a page in this block exhibits read errors that cannot be corrected any longer by the error correction code (ECC) in the NAND flash memory controller.

The background management and optimization of the TVS values applied when reading data relies on RBER rates observed during background reads. TVS values are stored as part of metadata. This basic background management and optimization approach has been proven to work well in planar (2D) NAND flash memory devices. However, the advent of 3D NAND flash memory devices has resulted in new distortion mechanisms that affect the RBER of NAND flash memory pages and blocks. Notably, 3D NAND flash memory devices exhibit an abrupt change in optimal voltage thresholds when switching from a P/E cycling phase to a retention phase, or due to read disturb effects. The change in optimal voltage thresholds is typically proportional with the number of P/E cycles (before retention or read disturb) that the NAND block has seen and is much more pronounced than in 2D flash memories.

As a result of the abrupt VTH change in 3D NAND flash memory devices, the prior threshold-voltage shifting algorithms are no longer adequate. Techniques have been developed, which can suitably be applied to 3D NAND flash memories. However, such techniques typically require repeatedly re-reading the failing pages, which is time and power consuming.

One or more embodiments of the disclosure are now described, with reference to FIG. 1 through FIG. 5. This disclosure generally relates to calibrating threshold voltage shift (TVS) values for a memory unit, such as non-volatile memory unit 200 shown in FIG. 2 and/or non-volatile memory unit 310 shown in FIG. 3. The present approach is notably applicable to memory units involving NAND flash memory cells, NOR flash memory cells, or phase-change memory (PCM) cells. Still, the description herein mostly refers to multi-bit NAND flash memories, for the sake of illustration.

The present method and its variants are collectively referred to as the "present methods". All references Sn refer to method blocks of the flowcharts of FIG. 5, while numeral references pertain to systems, devices, components, and concepts involved in the embodiments of the disclosure.

Figure 2:
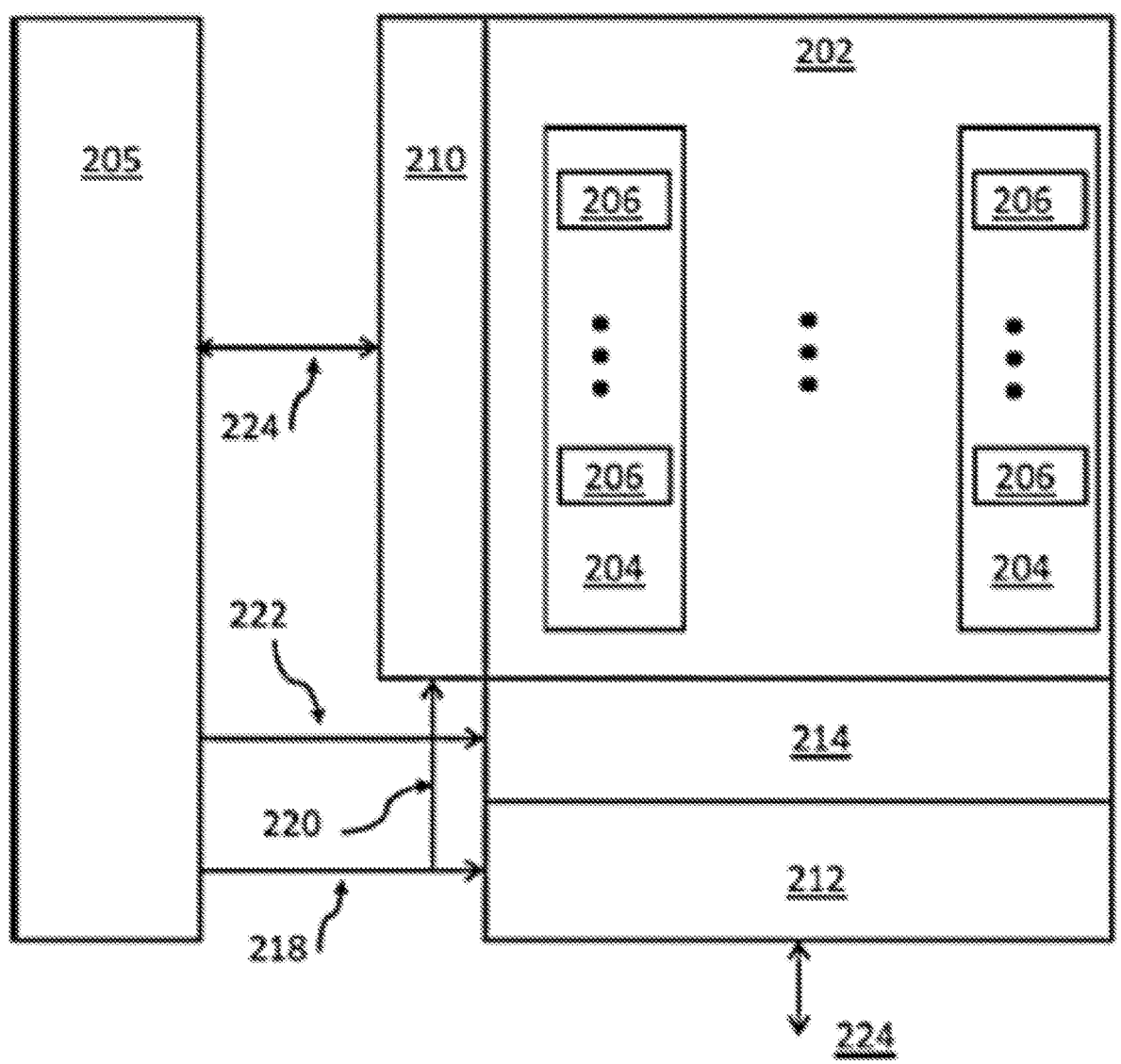
FIG. 2 depicts a flash memory module that may utilize one or more embodiments of the disclosure.

Generally, a memory unit can be regarded as including strings of memory cells, which are organized into memory pages (also referred to as "pages" herein), where the memory pages 206 are themselves organized into memory blocks 100, 204 (or "blocks"), see FIGS. 1 and 2, respectively. That is, the memory unit includes cells, which form strings, where the strings are organized into memory pages, themselves organized into blocks. Each memory page can be regarded as including or corresponding to a plurality of memory cells. However, if the non-volatile memory unit is a multi-bit NAND flash, then one cell may contain data from multiple pages. Various types of multi-bit NAND flash memory are known, to which the present approach is applicable. For example, a multi-bit NAND flash memory unit may involve triple-level cells (TLCs), quad-level cells (QLCs), or penta-level cell (PLCs), which are generally referred to as multi-level cells (MLCs).

FIG. 1 illustrates an exemplary memory cell organization of a NAND flash memory device. The memory cells are assumed to be programmed as MLCs, in this example. In detail, FIG. 1 illustrates the organization of cells, such as cell 101, cell 102, etc. inside a memory block 100. The block 100 involves cell strings for each bit line (BL). Each bit of an MLC is mapped to a different page. In typical flash memory device architectures, more than one page can share the same word line (WL). This is notably the case for MLCs, where the least significant bits (LSB) and most significant bits (MSB) of a cell are mapped to different pages.

Figure 5:
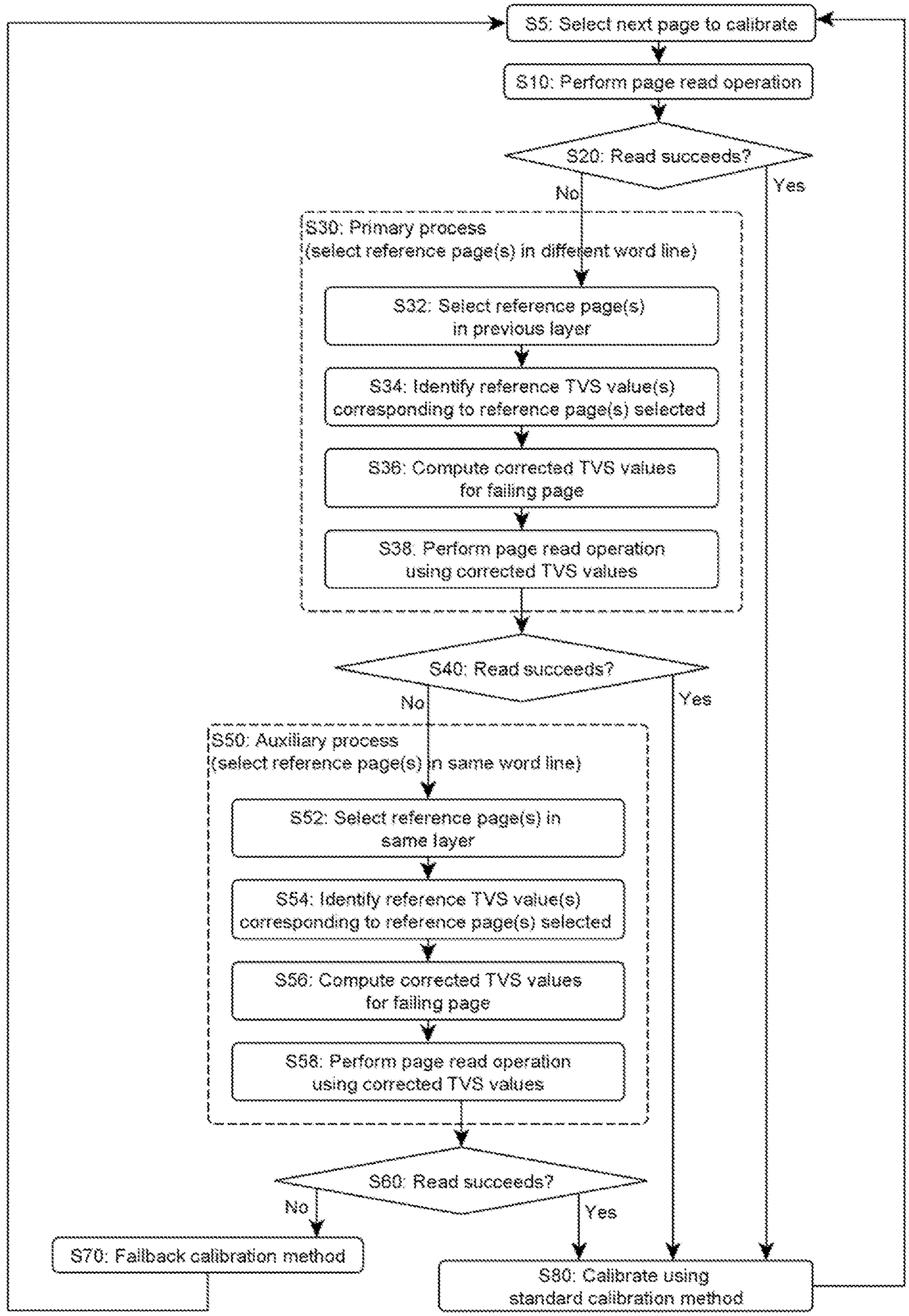
FIG. 5 depicts a method of calibrating threshold voltage shift values for a non-volatile memory unit, in accordance with embodiments of the disclosure.

As shown in the flowchart of FIG. 5, a method of calibrating threshold voltage shift values for a non-volatile memory unit is depicted. The method may repeatedly perform read operations (e.g., see block S10 in FIG. 5), e.g., as part of a calibration procedure. Performing the read operation causes the read a given page 40 (e.g., see FIG. 4) of the memory pages. The read operation is performed based on given TVS values for the given page 40. As the one skilled in the art knows, at least one TVS value is needed. Several TVS values may be needed in certain cases, depending on the page being read.

Such read operations are expected to be successful in most cases. In certain cases, however, the read operation may happen to lead to a read failure (block S20: No). In response to such a read failure of page 40, the method determines (block S30 and block S50) corrected TVS values for the failing page. Particularly, the corrected TVS values are determined according to reference TVS values of reference memory pages 41, 42, i.e., pages that are distinct from the failing page 40. In general, one or more corrected TVS values may accordingly be determined, based on one more TVS values corresponding to or associated with one or more reference pages 41, 42. That is, in certain cases, a single TVS value is needed. However, multiple TVS values may be needed for certain page types, this depending on the memory cell configuration.

The corrected TVS values may for instance be obtained according to a suitable heuristic, which may depend on the reference page(s) selected or, more precisely, on the existing relation between the failing page and the reference page(s). For example, the corrected TVS values may be determined based on an expected TVS drift relation, which depends on a structural relationship between the failing page 40 and the applicable reference pages 41, 42 selected.

Having determined the corrected TVS values, the method can subsequently perform a read operation (block S38 and block S58) to read the failing page 40, based on the corrected TVS values. The above process will typically be repeatedly performed, for many pages, as depicted in the flow diagram of FIG. 5.

As one skilled in the art may appreciate, the structural architecture of the memory unit and the manufacturing processes used to manufacture it determine the extent of the similarity between the pages 40, 41, 42. This, in turn, can be exploited to choose or select which pages 41, 42 may be used for correcting TVS values for a failing page 40. Pages having similar characteristics can be tracked as part of the solid-state drive (SSD) firmware.

Assume that the memory unit is a flash memory. When data is read from a flash page using incorrect TVS values, the number of errors can increase beyond the error correction capabilities of the flash controller, in which case the original data is essentially unreadable. Now, instead of attempting to find suitable TVS values by repeatedly re-reading the failing page 40 (as done in prior methods), an example of the present disclosure exploits TVS values of neighboring pages (e.g., similar pages in the same memory block) to determine corrected TVS values of the failing page 40.

The method postulates that changes in TVS values of memory page are often correlated. For example, such changes may be vertically correlated (TVS values of pages of the same type in neighboring layers of the same type drift according to a similar pattern) and/or horizontally correlated (changes in neighboring TVS values of pages that share the same flash cells shift in similar directions). Therefore, if suitable (or even optimal) TVS values of distinct pages (e.g., in the same layer or in other layers) are known, it is possible to estimate corrected TVS values for the failing page. For example, upon a read failure, the present method may infer TVS values either from: (i) pages of the same type (from neighboring layers that were recently calibrated); or (ii) by leveraging the TVS values of other pages that share the same flash cells. Once suitably corrected TVS values have been determined, the present methods can perform a read operation based on the corrected TVS values.

The proposed approach differs significantly from prior methods. For example, it has been proposed to find appropriate TVS values by repeatedly reading a failing page, as noted above. The present invention, instead, exploits TVS values of reference pages (e.g., similar pages in a NAND flash block) to identify corrected TVS values for the failing page.

In particular, correction methods have been proposed, which rely on changing the TVS values according to some heuristic and repeatedly reading the failing page. Such an approach is feasible if the number of possible combinations of TVS values is small enough for the correction procedure to complete in a reasonable amount of time. The number of TVS values, however, increases exponentially with the number of bits stored per flash cell. For example, assume that a QLC flash page requires seven TVS values for reading and each TVS value has a range of +/−50 units, hence resulting in 101 possible distinct values for each TVS. Thus, the total number of read operations required by such prior methods to guarantee finding satisfactory TVS values is equal to $101^7$, i.e., more than 100 trillion read operations. Even if the range of a TVS is scanned in larger increments (e.g., in steps of 10 units), such a technique would still require more than 10 million page read operations, which may well be intractable in practice.

Other techniques are known, which aim at maintaining optimal TVS values that allow reading a flash page with low errors by differentiating between a permanent shift in TVS values due to cycling versus a temporal shift in TVS values due to retention or read disturb effects. By contrast, the embodiments of the present disclosure addresses situations, where maintaining the TVS values fails, and a page is unreadable. For example, available TVS values do not make it possible to read the data and therefore it is not possible to calibrate the TVS values or relocate the data.

Further approaches have been proposed, which rely on a statistical balance between zeroes and ones produced when applying a certain TVS value, whereby the TVS value is shifted in the direction that equalizes the number of zeros and ones. Then, read operations need be repeated. By contrast, embodiments of the present disclosure infer TVS values from reference pages (e.g., similar pages in the same block), without requiring performance of additional reads.

Other known approaches involve TVS value calibration methods, which rely on a starting set of TVS values that allow reading the data (i.e., the error count is low enough for the data to pass error correction). By contrast, embodiments of the present disclosure addresses situations where such TVS values may not be available, the number of errors exceeds the capabilities of the ECC, and therefore the error count cannot be used to guide the TVS calibration.

Other known approaches maintain and calibrate TVS values for a group of pages with similar characteristics to reduce the number of metadata stored. A prerequisite for such techniques is that there is a set of existing TVS values that makes it possible to read all the pages in a group (i.e., the error count is low enough for the data to pass error correction). By contrast, embodiments of the present disclosure addresses situations where it may not be possible to read data with the currently available TVS values, which prevents performing a calibration for a current page. Note, the concept of "group" arises because typical calibration processes split a block into groups of pages with similar error characteristics (e.g., to calibrate only a single page within each group).

Further known methods have been proposed, which aim at achieving a balance between reducing the calibration overhead (the number of flash page reads performed) and the error count of the TVS values produced. Such known methods first read a page in a group and, depending on the resulting error count, select a calibration method. If the error count is low, a fast calibration method can be utilized to reduce the overhead. If the error count is high, a calibration method with higher overhead is used to appropriately reduce errors. However, such an approach may not even be able to commence the calibration procedure if it is not possible to read data using the available TVS values.

Embodiments of the present disclosure are now described in more detail, in reference to particular embodiments of the invention. To start with, the present method blocks may be performed for recovering data. In variants, the present method blocks are performed as part of a calibration procedure. The calibration of the TVS values may advantageously be iteratively performed, so as to gradually correct TVS values that may subsequently serve to correct TVS values for page being currently tested, if necessary. Accordingly, the reference TVS values (corresponding to the reference pages 41, 42 in FIG. 4) happen to be already calibrated (see the iterative steps S5-S80 in FIG. 5), prior to performing a block S10 read operation for a current page.

Note, this block S10 read operation may typically be performed as part of a calibration initialization procedure. In case of a read failure (block S20: No) of the calibration initialization procedure, corrected TVS values can be determined for the failing page, as explained earlier. Thanks to the gradual and iterative approach, suitably calibrated reference TVS values are already available, which can be used to correct the TVS values for the current page 40. In other words, the TVS correction is preferably performed after calibrating the reference pages 41, 42, be it to ensure that the reference TVS values have not deviated from their optimal values. Preferably, only selected pages of each block are calibrated, to make the calibration procedure more tractable.

The same calibration procedure may be used to calibrate each page. Still, this calibration procedure may possibly include several stages, as discussed later in reference to FIG. 5. In variants, or in addition, distinct calibration algorithms may possibly run (in the background), in parallel.

The corrected TVS values are typically determined as follows. First, the reference pages 41, 42 are selected (see block S32 and block S52 in FIG. 5), according to predetermined rules. Examples of such predetermined rules are disclosed below. Second, the corresponding TVS values are identified (block S34 and block S54 in FIG. 5) in accordance with the reference pages 41, 42 selected. Third, the corrected TVS values (for the current page 40) are obtained (block S36 and block S56 in FIG. 5) or derived based on the reference TVS values identified for the reference pages 41, 42 selected.

Various heuristics can be contemplated to obtain or derive the corrected TVS values. For example, corrected TVS values may be obtained by selecting one or more TVS values among the values identified in respect to the selected pages 41, 42. In other words, the corrected TVS values are inferred to be equal to the reference TVS values of the selected pages 41, 42. In other cases, the corrected TSV values may be derived or inferred inside a range spanned by the reference TVS values of the selected pages 41, 42, e.g., using a analytical function or a more elaborated model, e.g., a supervised cognitive model trained based on labels corresponding to the page types, for example. Analytical functions are thought to be satisfactorily used, in most situations. In an exemplary analytical function, the corrected TVS values can be obtained by deriving or computing the reference TVS values identified (block S36 and block S56 of FIG. 5). More particularly, the corrected TVS values can be obtained by averaging the reference TVS values identified. Any suitable average formula may be used, starting with the arithmetic average. The reference TVS values may possibly have to be weighted, depending on drift expectations, which themselves depend on the actual memory architecture. A weighted average formula can be relied on to infer or otherwise determine the corrected TSV values. The actual function used to correct the current TVS values typically depends on the type of failing page and the selected page types, i.e., it depends on the relation between the failing page and the reference page selected.

As illustrated in FIG. 1 and in FIG. 4, memory cells 101 are typically connected by word lines (WLi) and bit lines (BLj), according to certain interconnection architectures. A word line and bit line relationship, respectively, are exemplary relationship types between the given memory page 40 and the reference memory pages 41, 42. Thus, the reference memory pages 41, 42 may advantageously be selected (block S32 and block S52 of FIG. 5), according to certain types of relationships. That is, one or more types of relationships may be first selected, prior to selecting reference page(s) in accordance with the selected relation(s). As noted above, the heuristic used to correct the current TVS values may further depend on the selected relationship types.

As shown in FIG. 4, subsets 45 of memory pages p can be identified, where the subsets 45 correspond to respective memory cells. Only two subsets 45 are highlighted in FIG. 4, which correspond to four pages (surrounded by dashed contours). However, the number of subsets is equal to the number of interconnections of word lines and bit lines. In other words, each subset 45 interconnects a respective word line (WL1 . . . WLN) with a respective bit lines (BL1 . . . BLM). As multi-bit cells are assumed, in this example, distinct pages in each subset correspond to distinct logical bits (LB1 to LB4). This also means that different voltage thresholds must be applied to read the corresponding pages.

The reference pages 41, 42 may possibly be selected within the same subset as the current page 40 or within one or more distinct subsets. For example, in FIG. 4, the page 40 and the page 41 belong to distinct subsets, whereby pages 40 and 41 do not share a same word line, as they belong to different layers. However, pages 40 and 41 correspond to a same bit line. They further correspond to a same logical bit. Thus, they are of the same type. In other words, the TVS values associated to page 41 may be appropriately related to correct efficient TVS values for page 40. Conversely, page 42 belongs to the same subset as page 40. This means that pages 40 and 42 share a same word line. However, because they are distinct, they necessarily correspond to distinct logical bits.

So, the reference page(s) 41, 42 may either be selected in the same subset or in distinct subsets (though sharing a same bit line) as the current page 40, depending on the selected relationships. The type(s) of relationship(s) desired between the selected reference pages and the current page determine(s) the subsets in which the reference pages are selected. In that respect, the embodiments of the disclosure first attempt to select reference pages in a previous layer, i.e., a page in a distinct subset but in the same bit line, which has already been calibrated, like page 41. Still, the embodiments of the disclosure may subsidiarily attempt to select other reference pages (like page 42) in the same subset, should the first calibration attempt fail, as per a two-stage methodology described below.

Note, FIG. 4 highlights a single page 41 and a single page 42, for simplicity. For clarity, in practice, the calibration can possibly come to select several reference pages in one or more distinct subsets (such as page 41) or in the same subset (such as page 42) as the subset to which the current page 40 belongs.

The page subsets may not necessarily all have the same configuration, as assumed in the example of FIG. 4. That is, certain pages (identified as "p") are meant to store data, while other pages (identified by a dash "-") may be mock pages. Mock pages are not meant to store data, which impacts the configuration of the corresponding cells and, in turn, the configurations of the page subsets. A same cell configuration means that the memory cells store the same number of bits, the mapping between voltage and logical bit values is the same, and the same default TVS values are applied to read the state of the memory cells. Because the page subsets may have different configurations, the reference pages should preferably be selected in a subset having a same configuration as the subset to which the current page 40 belongs. Selecting pages in a subset having a similar configuration increases the chance for the TVS values of the selected pages to show similar TVS drifts.

In the above examples, the reference pages selected may correspond to the same bit line as the current page. However, other selection schemes can be contemplated, which may for instance select reference pages corresponding to different bit lines, having a same logical bit or not.

The following describes embodiments in which the calibration first attempts to select reference pages in a previous layer and only subsidiarily attempts to select pages in a same page subset as the current page, should the first calibration attempt fail. To that aim, distinct groups of reference pages can be identified, following principles as described earlier. The first group concerns subsets of pages (such as page 41) corresponding to different word lines but sharing the same bit line as the current page 40, while the second group corresponds to pages (such as page 42) in the same subset as the current page 40. The calibration may iteratively determine the corrected TVS by first attempting to determine (block S30 in FIG. 5) a first subset of corrected TVS values, based on reference TVS values pulled from the first group of reference pages. Upon failure (block S40: No) to read the current page 40 based on the TVS values corrected at block S30, the calibration will subsidiarily attempt to determine (block S50 in FIG. 5) a second subset of corrected TVS values, using reference TVS values pulled from the second group. In other words, the iterative scheme first attempts to exploit vertical TVS values, which are expected to be closer to the actual TVS value of the current page 40. If the subsequent read operation fails, the algorithm attempts to exploit parallel TVS values, which are expected to be less well correlated. Note, if the auxiliary procedure (block S50 in FIG. 5) also fails too (block S60 in FIG. 5: No), another or conventional calibration technique may be utilized (block S70 in FIG. 5).

The above methods have been succinctly described in reference to the accompanying drawings and may accommodate a number of variants. Several combinations of the above features may be contemplated. For example, FIG. 5 shows a flow describing a multi-stage calibration procedure, in which page read operations are repeatedly performed (block S10) by successively selecting (block S5) pages to calibrate. The calibration may repeat for every page if pages being considered for TVS calibration can be successfully read (see block S20: Yes, block S80, block S5, and block S10).

If, however, a read failure occurs (block S20: No) for the current page, a primary process (block S30) is started. This process aims at inferring TVS values based on reference pages selected in different word lines (with respect to current page 40), such as page 41 in FIG. 4. The primary process decomposes into several sub-steps. At block S32, the calibration selects one or more reference pages in one or more previous layers, i.e., layers that have previously been calibrated. At block S34, reference TVS values are identified, which are values corresponding to the reference pages selected at block S32. At block S36, one or more corrected TVS values are computed for the failing page, using a suitable heuristic. A page read operation is subsequently performed (block S38) based on the corrected TVS values. If the page can successfully be read (block S40: Yes), the calibration proceeds (block S5) to the next page.

Else (block S40: No), an auxiliary process (block S40) is started, which relies on reference pages selected in the same word line as the failing page. One or more reference pages are selected in the same layer at block S52. Block S54 identify reference TVS values corresponding to the reference pages selected at block S52. Corrected TVS values are computed at block S56. A page read operation is subsequently performed (block S58) based on the corrected TVS values inferred at block S56. If the page can be successfully read (block S60: yes), the calibration proceeds (block S5) to the next page. Else (block S60: No), a conventional calibration process can be started, as a fallback method. Then, the process selects (block S5) a next page, and so on.

Figure 3:
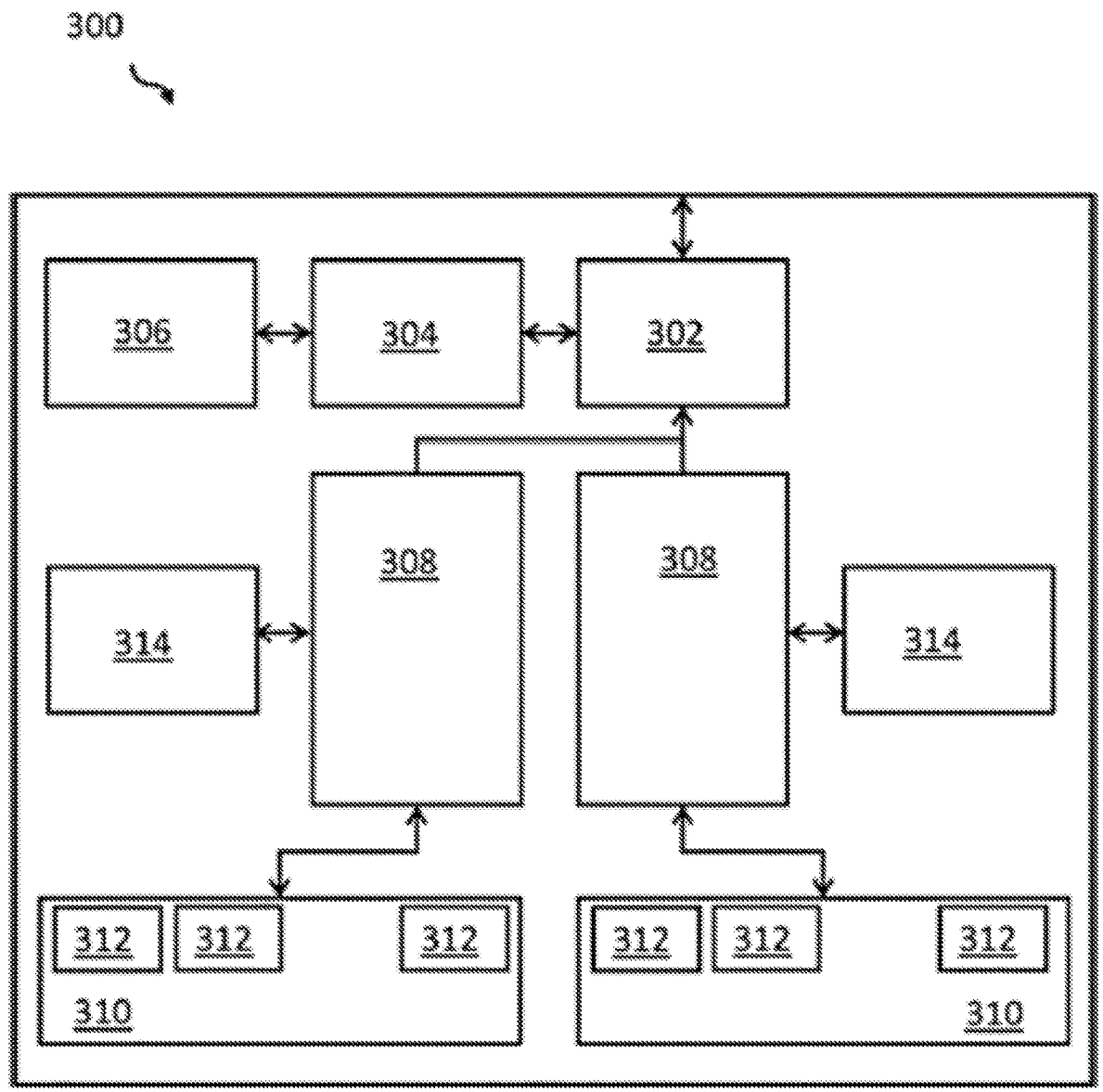
FIG. 3 depicts a flash card that may utilize one or more embodiments of the disclosure.

Other embodiments of the disclosure are now described in reference to FIGS. 1-3. For example, FIG. 1 and FIG. 3 depict exemplary memory systems. The systems include a non-volatile memory unit and a controller. As described earlier, the memory unit includes strings of memory cells 101 organized into memory pages, which are themselves organized into blocks. The controller is connected to the memory cells. The controller is generally configured (e.g., programmed to call machine readable instructions that cause the controller to perform the disclosed calibration) to calibrate TVS values for the non-volatile memory unit. As explained earlier, the controller does so by inferencing corrected TVS values. In other words, in response to a read failure, the controller may determine corrected TVS values based on reference TVS values corresponding to reference pages, where the latter can notably be selected according to a two-stage approach as described earlier in reference to FIG. 5. The operations performed by the controller may typically be carried out as part of a calibration procedure or for recovering data.

The memory cells of the non-volatile memory unit may be NAND flash memory cells, NOR flash memory cells, PCM cells, or the like. So, the controller can be a flash controller or another appropriate solid-state drive (SSD) controller. TVS inferences can notably be implemented in an SSD controller as a fallback in case data cannot be read using nominal or the TVS values stored in firmware. TVS inferencing as proposed herein makes it possible to increase the likelihood that data can be read from the non-volatile memory unit. The proposed approach provides a low-latency solution to handle errors; the overhead is in the order of a page read, i.e., lower than iterative (soft) decoding techniques. In addition, for flash system controllers, TVS inferencing can be leveraged to complement read error handling for user reads.

FIGS. 2 and 3 respectively depict an exemplary flash memory module and a flash card (e.g., as used in a data storage system), which can be used to implement the proposed concept. FIG. 2 shows a flash memory module 200, which includes one or more memory dies, each implementing at least one memory array 202, e.g., formed of 3D NAND flash memory cells. As seen in FIG. 2, the memory cells of the array 202 are physically arranged in multiple blocks 204, themselves comprising multiple physical pages 206.

As known, a NAND flash memory as employed in the memory array 202 is erased prior to being programmed. Furthermore, some constraints may possibly arise from the architecture of the NAND flash memory. For example, the smallest granule of storage that can be erased may be a block 204 and the smallest granule of storage accessible by a read or write operation can be fixed to the size of a single physical page 206. In this regard, it should be appreciated that the logical block addresses (LBAs) provided by a host device correspond to logical pages within a logical address space, wherein each logical page typically has a size of, e.g., 4 kilobytes (kB). Physical pages 206, in contrast, typically have a larger size, e.g., 16 kB, and can thus correspond to multiple logical pages.

The flash memory module 200 further comprises a row decoder 210, through which word lines of the memory array 202 can be addressed (address line 220), and a column decoder 212, through which bit lines of the memory array 202 can be addressed (address line 218). In addition, the flash memory module 200 comprises a read/write circuit 214 that enables the memory cells of a physical page 206 to be programmed or read in parallel.

The flash controller circuitry 200 additionally comprises a control circuit 205 that provides chip-level control of operations (e.g., commands 222, 224) of the memory array 202, including read and write accesses made to physical memory pages 206, erasure of data in blocks 204, and the amplitude, duration and plurality of related voltages applied to the memory array 202. The data input/output to/from the flash memory module 200 flow along the double arrow of operation 224. The control circuit 205 can further be configured to perform TVS inferencing and/or calibration, as described above.

FIG. 3 shows a block diagram of a flash card 300, which can be used in a data storage system, such as a computer, storage server, or the like. The present methods may be implemented at the level of the flash card 300. The flash card 300 includes a gateway 302 that serves as an interface between the flash card 300 and RAID controllers or host bus adapters (HBA) of the data storage system. The gateway 302 is coupled to a general-purpose processor (GPP) 304, which can be configured (e.g., by program code) to perform pre-processing on operations received by the gateway 302 and/or to schedule servicing of the operations by the flash card 300. The GPP 304 is coupled to a GPP memory 306 (random access memory, typically DRAM).

The gateway 302 is further coupled to one or more multiple flash controllers 308, each of which controls a respective NAND flash memory system 310. The NAND flash memory system 310 comprises multiple individually addressable NAND flash memory storage devices 312. The flash controllers 308 can be implemented, for example, by an application-specific integrated circuit (ASIC) and/or a field programmable gate array (FPGA), and/or a microprocessor, and each flash controller 308 can have an associated flash controller memory 314 (e.g., DRAM). In embodiments in which flash controllers 308 are implemented with an FPGA, the GPP 304 may program and configure the flash controllers 308 during start-up and data of the higher-level data storage system. After start-up, in operation, the flash controllers 308 receive read and write operations from the gateway 302 that requests to read data stored in the NAND flash memory system 310 and/or to store data in the NAND flash memory system 310. The flash controllers 308 service these operations, for example, by accessing the NAND flash memory system 310 to read or write the requested data from or into the NAND flash memory system 310, or by accessing a memory cache (not illustrated) associated with the NAND flash memory system 310.

The flash controllers 308 typically implement a flash translation layer (FTL) that provides a logical-to-physical address translation to enable access to specific memory locations within the NAND flash memory system 310. In general, an operation received by the flash controller 308 from a host device, such as a higher-level processor system, contains the logical block address (LBA) at which the data is to be accessed (read or written) and, if a write operation, the write data to be stored to the NAND flash memory system 310. The operation may also specify the amount (or size) of the data to be accessed. Other information may also be communicated depending on the protocol and features supported by the data storage system. The flash translation layer translates LBAs received from a RAID controller into physical addresses assigned to corresponding physical locations in the NAND flash memory system 310. The flash controllers 308 may perform address translations and or store mappings between logical and physical addresses in a logical-to-physical translation data structure, such as a logical-to-physical translation table (LPT), which may conveniently be stored in the flash controller memory 314. Such flash controllers 308 may, each, be configured to perform TVS inferencing and/or calibration, as described above. In variants, TVS values can be inferred by the GPP 304.

More generally, some of the aspects described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

Next, according to a final aspect, the invention can be embodied as a computer program product for calibrating TVS values for a non-volatile memory unit. The computer program product comprises a computer readable storage medium having program instructions (e.g., FPGA instructions) embodied therewith. Such program instructions are executable by processing means of a controller connected to the memory cells, to cause the processing means to perform steps as described earlier in reference to the present methods.

Thus, the present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, Java, Go, Python, Ruby, Scala, Swift, Java, Go, Python, Ruby, Scala, Swift, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been described with reference to a limited number of embodiments, variants and the accompanying drawings, it will be understood by those skilled in the art that various changes may be made, and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other types of memory cells and memory cell organizations can be contemplated.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of calibrating threshold voltage shift values for a non-volatile memory unit including strings of memory cells organized into memory pages, the memory pages each organized into blocks, the method comprising:
   performing a first read operation to read a given page of the memory pages utilizing given one or more threshold voltage shift values for the given page;
   in response to a read failure of the first read operation, determining one or more corrected threshold voltage shift values based on one or more reference threshold voltage shift values of one or more reference pages of the memory pages; and
   performing a second read operation to read the given page utilizing the one or more corrected threshold voltage shift values.

2. The method according to claim 1, further comprising:
   calibrating the one or more threshold voltage shift values of the one or more reference pages, prior to performing the second read operation to read the given page.

3. The method according to claim 2, wherein the first read operation to read the given page is performed as part of a calibration initialization procedure and wherein the one or more corrected TVS values are determined in response to a read failure of the calibration initialization procedure.

4. The method according to claim 1, wherein determining the one or more corrected threshold voltage shift values comprises:
   selecting the one or more reference pages;
   identifying the one or more reference threshold voltage shift values in accordance with the selected one or more reference pages; and
   deriving the one or more corrected threshold voltage shift values based on the one or more reference threshold voltage shift values identified.

5. The method according to claim 4, wherein the memory cells are connected by word lines and bit lines, according to an interconnection architecture defining relations between the memory pages, wherein subsets of the memory pages interconnect respective ones of the word lines with respective ones of the bit lines, and wherein the one or more selected reference pages are selected according to one or more given relations of the relations.

6. The method according to claim 5, wherein the one or more corrected threshold voltage shift values are obtained according to a heuristic that depends on the one or more given relations.

7. The method according to claim 5, wherein the given page and the one or more selected reference pages belong to distinct ones of the subsets and wherein the given page and the one or more selected reference pages do not share a same word line.

8. The method according to claim 7, wherein the one or more selected reference pages and the given page correspond to a same one of the bit lines and a same logical bit.

9. The method according to claim 5, wherein the given page and the one or more selected reference pages belong to a same one of the subsets, wherein the given page shares a same word line and same bit line with the one or more selected reference pages, and wherein the one or more selected reference pages and the given page correspond to distinct logical bits of a same one of the memory cells.

10. The method according to claim 9, wherein selecting the one or more reference pages comprises:
    selecting several reference pages in the same one of the subsets.

11. The method according to claim 5, wherein the one or more selected reference pages and the given page belong to subsets having a same memory cell configuration.

12. The method according to claim 5, wherein the selected reference pages are grouped into a first group of pages and a second group of pages, respectively corresponding to a first group of reference threshold voltage shift values and a second group of reference threshold voltage shift values, wherein the first group of pages and the second group of pages imply different types of relations, and wherein
    determining the one or more corrected threshold voltage shift values comprises:
    attempting to determine first corrected threshold voltage shift values based on the first group of reference threshold voltage shift values; and
    in response to a read failure of the second read operation to read the given page based on the first corrected threshold voltage shift values, determining second corrected threshold voltage shift values based on the second group of reference threshold voltage shift values.

13. The method according to claim 4, wherein the one or more corrected threshold voltage shift values are obtained by selecting one or more threshold voltage shift values among the reference threshold voltage shift values identified.

14. The method according to claim 4, wherein the one or more corrected threshold voltage shift values are obtained by:
    determining a range of threshold voltage shift values spanned by the reference threshold voltage shift values identified; and
    determining the one or more corrected threshold voltage shift values as one or more threshold voltage shift values residing inside the determined range.

15. The method according to claim 14, wherein
    the set of one or more corrected threshold voltage shift values are determined by performing serial read operations based on the one or more threshold voltage shift values residing inside the determined range.

16. The method according to claim 4, wherein the one or more corrected threshold voltage shift values are obtained by a linear function of the identified reference threshold voltage shift values.

17. The method according to claim 13, wherein the one or more corrected threshold voltage shift values are obtained by averaging the identified reference threshold voltage shift values.

18. A memory system comprising:
    a non-volatile memory unit including strings of memory cells organized into memory pages, the memory pages organized into blocks, and
    a controller connected to the memory cells, the controller configured for calibrating threshold voltage shift values for the non-volatile memory unit, by:
    performing a first read operation to read a given page of the memory pages, utilizing given one or more threshold voltage shift values for the given page;
    in response to a read failure of the first read operation, determining one or more corrected threshold voltage shift values utilizing one or more reference threshold voltage shift values of one or more reference pages of the memory pages; and performing a second read operation to read the given page utilizing the one or more corrected threshold voltage shift values.

19. The system according to claim 18, wherein the memory cells of the non-volatile memory unit are selected from a group comprising NAND flash memory cells, NOR flash memory cells, and phase-change memory cells.

20. A computer program product for calibrating threshold voltage shift values for a non-volatile memory unit including strings of memory cells organized into memory pages, themselves organized into blocks, the computer program product comprising a computer readable storage medium having program instructions embodied therewith, the program instructions executable by a controller connected to the memory cells, to cause the controller to:
perform a first read operation to read a given page of the memory pages, utilizing given one or more threshold voltage shift values for the given page,
in response to a read failure of the first read operation, determine one or more corrected threshold voltage shift values based on one or more reference threshold voltage shift values of one or more reference pages of the memory pages, and
perform a second read operation to read the given page utilizing the one or more corrected threshold voltage shift values.

* * * * *